(12) United States Patent
Suzuki et al.

(10) Patent No.: US 7,928,645 B2
(45) Date of Patent: Apr. 19, 2011

(54) AIRTIGHT CONTAINER AND DISPLAY DEVICE USING THE AIRTIGHT CONTAINER, AND MANUFACTURING METHOD THEREFOR

(75) Inventors: Yoshio Suzuki, Isehara (JP); Kazuya Ishiwata, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 47 days.

(21) Appl. No.: 12/475,965

(22) Filed: Jun. 1, 2009

(65) Prior Publication Data

US 2009/0302734 A1 Dec. 10, 2009

(30) Foreign Application Priority Data

Jun. 5, 2008 (JP) ................. 2008-148200

(51) Int. Cl.
*H01J 1/62* (2006.01)
(52) U.S. Cl. ........................ 313/495; 313/497
(58) Field of Classification Search .......... 313/495–497, 313/336, 351, 309
See application file for complete search history.

(56) References Cited

U.S. PATENT DOCUMENTS 5,909,033 A 6/1999 Koga et al. ............ 257/10

FOREIGN PATENT DOCUMENTS

| JP | 9-277586 | 10/1997 |
|---|---|---|
| JP | 2000-251680 | 9/2000 |
| JP | 2006-66337 | 3/2006 |
| JP | 2007-335241 | 12/2007 |

*Primary Examiner* — Joseph L Williams
(74) *Attorney, Agent, or Firm* — Fitzpatrick, Cella, Harper & Scinto

(57) ABSTRACT

An airtight container includes a first substrate and a second substrate facing the first substrate and joined thereto using joint members. The first substrate has a groove extending on a surface of the first substrate and a wiring provided along a direction of the extended groove. The wiring includes a section inside and along the groove and a section outside the groove and extending from the section inside the groove, and the first substrate includes joint members provided on and across the section of the wiring outside the groove. In addition, a frame is joined on the second substrate by second joint members and is interposed between the first substrate and the second substrate. The frame is joined to the first substrate by the first joint members.

8 Claims, 6 Drawing Sheets

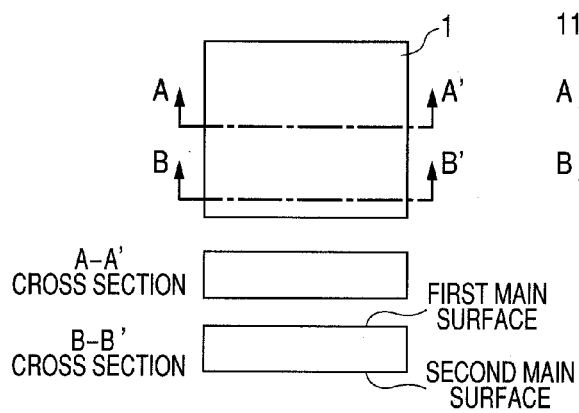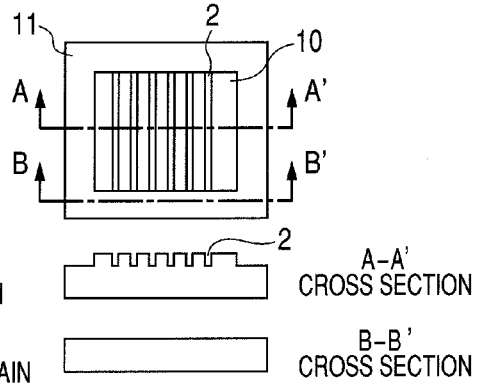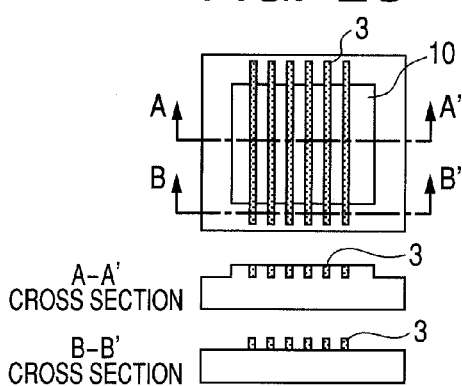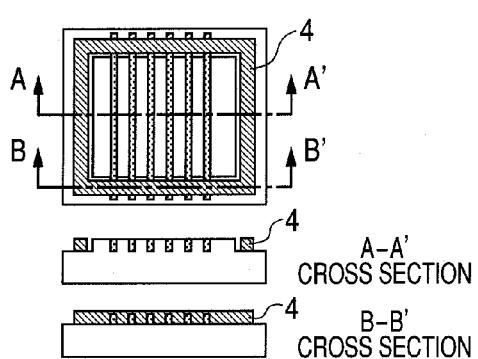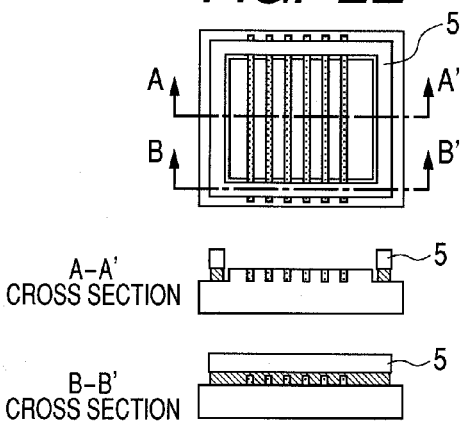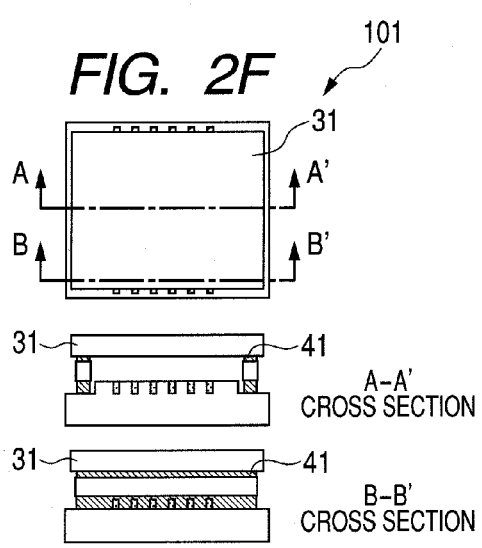

AIRTIGHT CONTAINER AND DISPLAY DEVICE USING THE AIRTIGHT CONTAINER, AND MANUFACTURING METHOD THEREFOR

BACKGROUND OF THE INVENTION

1. Field of the Invention

The present invention relates to an airtight container and a display device in which a wiring substrate having wirings arranged inside grooves formed on a surface of the wiring substrate is used.

2. Description of the Related Art

Examples of a flat panel display include a liquid crystal display (LCD), a plasma display (PDP), an inorganic EL display, an organic EL display (OLED), and a field emission display (FED). Those flat panel displays are provided with a flat-shaped airtight container, and a plurality of wirings are formed inside thereof (internal space). In the LCD, inside the airtight container, a liquid crystal material is disposed, and in PDP, discharge gas is disposed inside the airtight container. In the EL display, predetermined gas such as nitrogen is disposed inside the airtight container, or a pressure inside the airtight container is kept lower than the atmospheric pressure. Besides, in FED, the pressure inside the airtight container is kept lower than the atmospheric pressure (preferably in vacuum). Then, the airtight container is formed, for example, by joining outer peripheries of a pair of substrates using a joint member having a sealing function and a bonding function so that the pair of substrates are held at a given gap. U.S. Pat. No. 5,909,033 discloses FED. The plurality of the wirings (wirings formed on one of substrates) formed inside the airtight container need to be extended from inside the airtight container so as to be connected to a drive circuit formed outside the airtight container.

Japanese Patent Application Laid-open No. H09-277586 discloses a technique for solving the reduced airtightness of joint portions in a case where positions for joining between the pair of substrates are set on the wirings for driving respective pixels.

On the other hands, along with progress of attaining high definition of the display, there occurred such cases in which heights of the wirings and precision of the wirings themselves became problems. To cope with those problems, as disclosed in Japanese Patent Application Laid-open No. 2000-251680, Japanese Patent Application Laid-open No. 2006-066337, and Japanese Patent Application Laid-open No. 2007-335241, a method is proposed that involves forming grooves on the substrate to provide the wirings within those grooves. According to this method, the wirings having a large film thickness may be provided onto the substrate by a printing method with high precision. Further, U.S. Pat. No. 5,909,033 discloses a silicon substrate having a concave portion on which a cathode and a withdrawn electrode around the cathode are located.

SUMMARY OF THE INVENTION

In a case where wirings are arranged inside grooves formed on a surface of a substrate so as to extend, and a pair of substrates are joined airtightly on the groove, this causes a difference between a thermal expansion coefficient of a substrate material and a thermal expansion coefficient of a wiring material filled inside the grooves, or sintering shrinkage of the wiring material. For that reason, there were cases of causing gaps between inner wall surfaces of the grooves and the wirings. As a result, there were cases where the airtightness of the joint portions was reduced.

Accordingly, it is an object of the present invention to provide a wiring substrate, an airtight container, and a display device, with which airtight joining may be attained on the wirings, even in a case where the wirings are arranged within the grooves formed on the substrate surface, and to provide a manufacturing method thereof.

A first invention of the present invention, which has been made to solve the above-mentioned problem, relates to an airtight container comprising a first substrate and a second substrate facing the first substrate, which are jointed with a joint member, the first substrate having a groove extending on a surface of the first substrate and a wiring provided along an extending direction of the groove, wherein; the wiring comprises a first section provided inside and along the groove, and a second section provided outside the groove so that the second section extends from the first section inside the groove, and the first substrate and the second substrate are jointed with the joint member provided on the second section so that the joint member intersects with the wiring outside the groove.

Further, a second invention of the present invention relates to a manufacturing method for an airtight container comprising a first substrate and a second substrate facing the first substrate, which are jointed, the first substrate having a groove extending on a surface of the first substrate and a wiring provided along an extending direction of the groove, the manufacturing method comprising; providing a first substrate having a groove extending on a surface thereof, to thereby form a wiring extending from an inside of the groove to an outside of the groove, providing a joint member on the second section so that the joint member intersects with the wiring outside the groove, and joining the first substrate and the second substrate through intermediation of the joint member.

Further, the present invention has such a feature that the first invention and the second invention described above are used in the display device including the airtight container and the manufacturing method thereof.

The present invention employs a structure in which the wirings formed on the substrate surface include sections formed within the grooves and sections formed on the flat substrate surface, and joining is carried out on the wirings of the section positioned on the flat substrate surface (outside grooves).

As a result, even if gaps are caused between inner walls of the grooves and the wirings arranged inside the grooves, the reduction of the airtightness at the joint section may be suppressed.

Further features of the present invention will become apparent from the following description of exemplary embodiments with reference to the attached drawings.

BRIEF DESCRIPTION OF THE DRAWINGS

FIGS. 2A, 2B, 2C, 2D, 2E and 2F illustrate process steps for forming the airtight container of the present invention.

DESCRIPTION OF THE EMBODIMENTS

Hereinafter, a detailed description is made of an exemplary embodiment of the present invention with reference to the drawings. However, dimensions, materials, and shapes of components, and their relative positions described in this embodiment are only illustrative of the present invention, and are not intended to limit the scope of the present invention unless otherwise specifically indicated.

Figure 1A:
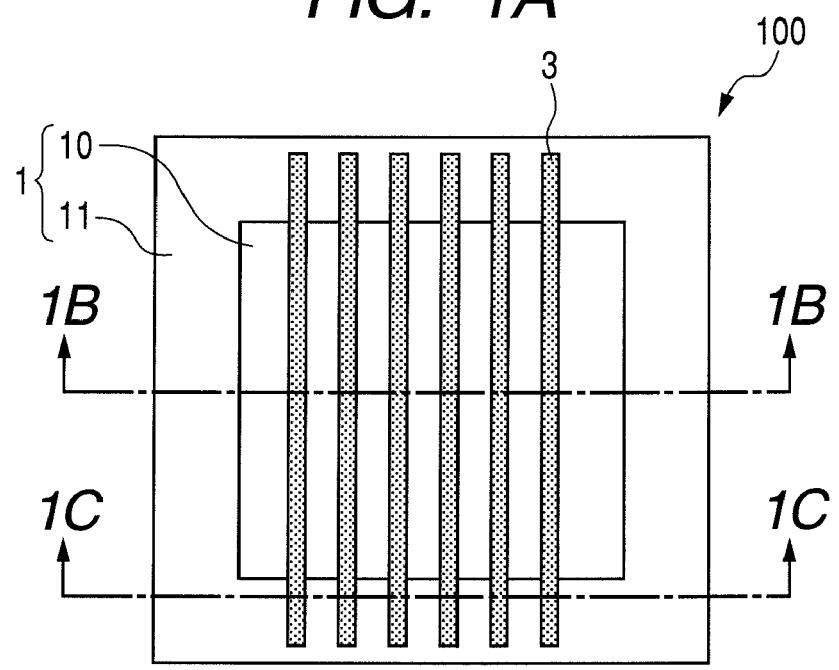
FIGS. 1A, 1B, and 1C are a plan view and sectional views of a substrate constituting an airtight container of the present invention.
Figure 1B:
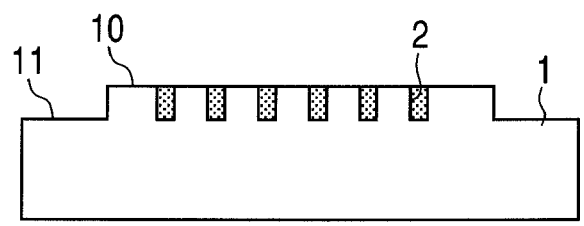
Figure 1C:
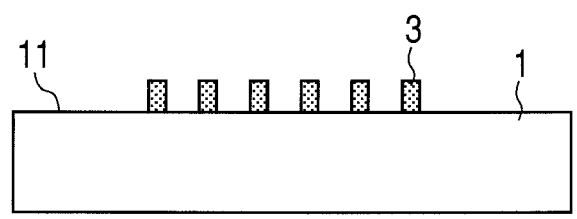

FIG. 1A is a schematic plan view of a wiring substrate (first substrate) 100, FIG. 1B is a schematic sectional view taken along the line 1B-1B of FIG. 1A, and FIG. 1C is a schematic sectional view taken along the line 1C-1C of FIG. 1A.

In FIGS. 1A to 1C, reference numeral 1 denotes a substrate, and reference numeral 2 denotes grooves formed on a surface of the substrate (first main surface), for burying the wirings. In this case, illustrated is a structure in which the grooves 2 extend along the surface of the substrate 1 in one direction. In the present invention, however, an extending direction of the grooves 2 may arbitrary be set in accordance with a required shape of the wiring. The surface of the substrate 1 includes a first region 10 and a second region 11 surrounding the first region 10. The grooves for burying the wirings are formed only in the first region 10, and in the second region 11, the grooves 2 for burying the wirings are not formed. Note that, a word "bury" used herein means a state in which side surfaces and a bottom surface (lower surface) of the wiring are surrounded, assuming that the cross section of the wiring has a rectangular shape. Wirings 3 are formed so as to extend over the first region 10 and the second region 11, and parts of the wirings 3 are buried inside the grooves 2 arranged within the first region 10. Specifically, the wirings 3 include portions arranged inside the grooves 2 (first region 10) and portions succeeding thereto arranged outside the grooves 2 (second region 11).

Further, in this case, outer peripheries of the first region 10 are all dug down. However, at least the substrate surfaces in the extending direction of the grooves 2 may only be dug down. However, in terms of forming an airtight container described below, it is preferred that the outer peripheries of the first region 10 be dug down to a depth, which is the same as that of the grooves 2.

Further, in this case, a structure is exemplified in which the grooves are formed by digging the surface of the substrate. However, contrary to this, banks may be formed on the surface of the flat substrate, to thereby form the grooves 2. In terms of a manufacturing cost and in view of manufacturing easiness, it is preferred to employ the structure in which the substrate surface was dug down.

Further, in this case, the wirings 3 are formed, in addition to the formation on the first region 10, a pair of end portions existing in the extending directions of the wirings 3 are formed on the second region 11, respectively. In the present invention, however, at least one of both ends of the wiring 3 in a parallel direction (extending directions of wirings 3) of the surface of the substrate is arranged on the second region 11.

Figure 6A:
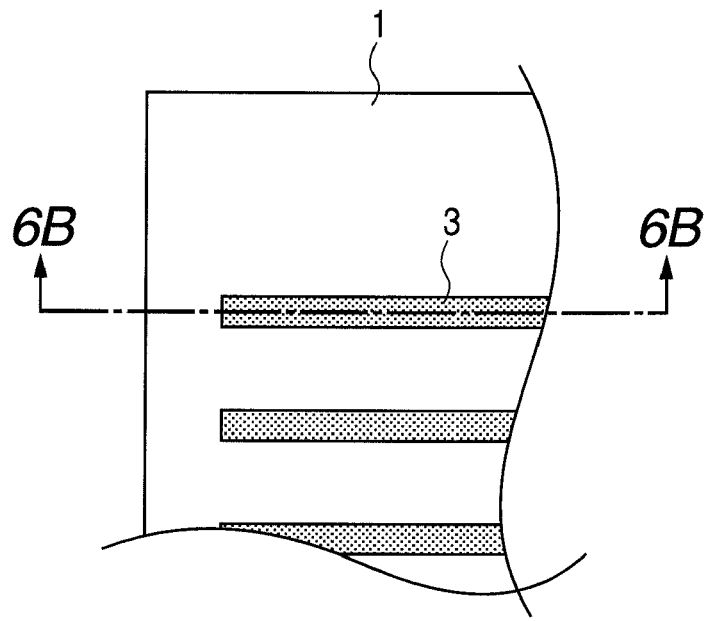
FIGS. 6A, 6B and 6C are a plan view and a sectional view of the other modified example of the substrate constituting the airtight container of the present invention.
Figure 6B:
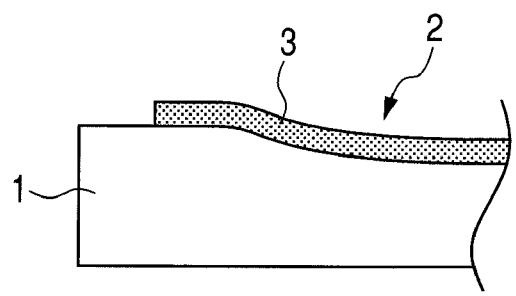
Figure 6C:
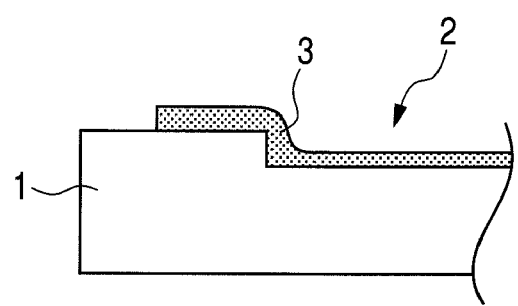

Note that, the example illustrated by FIGS. 1A to 1C is an example in which the first region 10 was dug down to a depth being the same as that of the grooves 2. However, the first region 10 may not necessarily be dug down. Specifically, as illustrated in FIG. 6C, a structure may be employed in which the grooves 2 are terminated in a stepped manner at a boundary between the first region 10 and the second region 11. Further, for example, as illustrated in FIG. 6B, a structure may be employed in which the depth of the terminations of the grooves 2 is gently reduced from the first region 10 toward the second region 11. As described above, it is preferred to gradually reduce the depth of the terminations of the grooves 2 in order to prevent the wirings 3 from being braked at the terminations of the grooves 2. Note that, FIGS. 6B and 6C are schematic sectional views taken along the line 6B-6B of FIG. 6A schematically illustrating a plan view of a vicinity of the outer periphery substrate 1.

With employing the structure described above for the wiring substrate 100, even if the joint portions being required with airtightness are formed on the wirings 3 located on the second region 11, joining with high reliability may be attained. Note that, the term "joining" used herein means a connection equipped with both the adhesion and the airtightness.

Figure 3A:
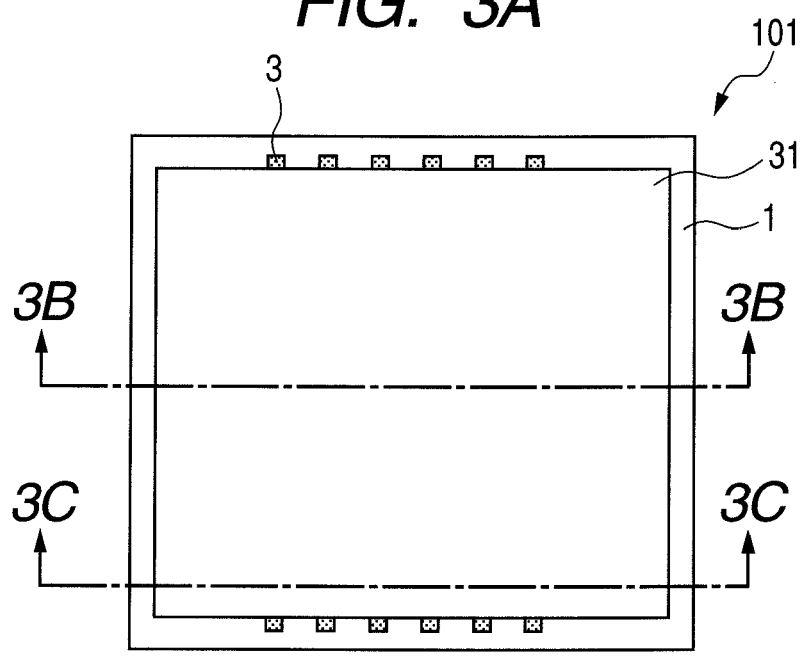
FIGS. 3A, 3B and 3C are a plan view and sectional views of the airtight container of the present invention.
Figure 3B:
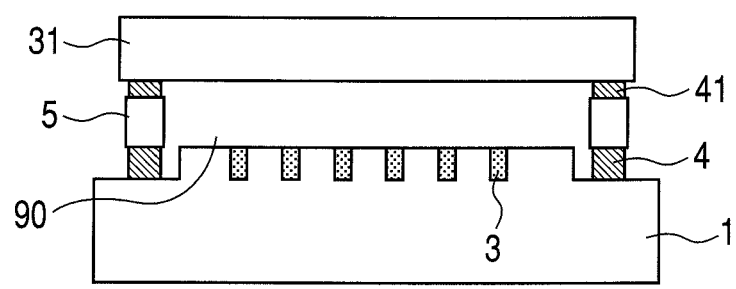
Figure 3C:
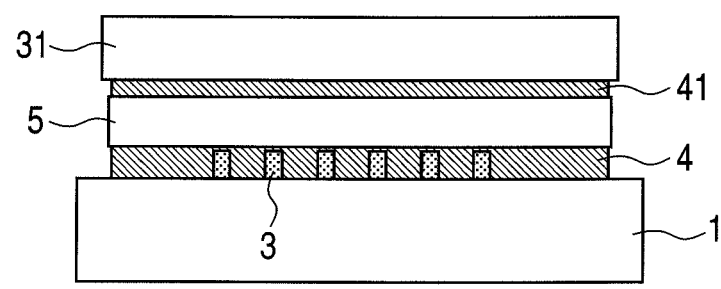

FIGS. 3A to 3C illustrate an example of an airtight container 101 in which the wiring substrate 100 of the present invention is used. FIG. 3A (uppermost) is a schematic plan view, and FIG. 3B (sublevel) is a schematic sectional view taken along the line 3B-3B of FIG. 3A, and FIG. 3C (lowermost) is a schematic sectional view taken along the line 3C-3C of FIG. 3A. The airtight container 101 includes a frame 5 provided between the first substrate 1 and a second substrate 31. The frame 5 and the first substrate 1 are joined with a first joint member 4, and the frame 5 and the second substrate 31 are joined with a second joint member 41. Further, an inside space 90 of the airtight container 101 is kept airtightly.

Hereinafter, an example of a method of manufacturing the airtight container 101 illustrated in FIGS. 3A to 3C is illustrated by using FIGS. 2A to 2F, and at the same time, an example of a method of manufacturing the wiring substrate 100 of the present invention is described. Note that, in FIGS. 2A to 2F, FIGS. 2A and 2B (uppermost) are schematic plan views, FIGS. 2C and 2D (sublevel) are schematic sectional views taken along the lines A-A' of FIGS. 2A and 2B, and FIGS. 2E and 2F (lowermost) are schematic sectional views taken along the lines B-B' of FIGS. 2A and 2B.

(Step 1) First, a first substrate 1 is provided (FIG. 2A).

The substrate 1 to be provided includes a first main surface and a second main surface, which are facing each other. The substrate 1 is not particularly limited as long as being an insulating material. For example, a glass substrate may be used.

(Step 2) A predetermined region (first region) 10 located at a center of a surface (first main surface) of the substrate 1 is subjected to etching, to thereby form a plurality of grooves 2 inside the first region 10 (FIG. 2B).

Further, a region surrounding the first region 10 is also subjected to etching, to thereby form a second region 11. Various known methods may be used as the etching method, but a sand blast method is preferably used, for example.

In a case where the sand blast method is employed, after formation of resist patterns for sand blasting, which correspond to the grooves 2, on the surface of the substrate 1, the sand blast treatment is carried out, whereby the grooves 2 having a predetermined shape may be formed. Through control of conditions of the sand blasting, for example, the grooves 2 having a width of 50 to 300 μm and a depth of 10 to 100 μm may be formed. In this case, the resist patterns corresponding to the second region 11 are formed, thereby being capable of digging down outer peripheries of the first region 10.

Note that, as described above, the present invention may adopt not only a structure in which the substrate surface is dug down, but also a methodology in which banks for forming the grooves 2 are provided onto the first region 10.

(Step 3) Inside the grooves 2 formed in Step 2 and on the second region 11, the wirings 3 are formed so as to extend over the first region 10 and the second region (FIG. 2C).

For example, in a case where the wirings 3 are formed by a screen printing method, a conductive paste (for example, metal paste being a paste containing metal particles) is used as a wiring material. Then, while filling the conductive paste into the grooves 2, printing of the conductive paste is successively carried out on the second region. After that, evaporation and drying of solvent within the conductive paste is carried out by heating at temperatures of 80 to 120° C. After that, baking is carried out at temperatures of 400 to 500° C. to form the wirings 3. At this time, owing to a small amount of glass frit component contained in the paste, the surface of the substrate 2 and the wirings 3 are brought into close contact in the region 11. Then, in the region 10, inside walls of the grooves 2 and the wirings 3 are brought into close contact. With this step, the wirings 3 are formed, each of which includes a section arranged inside the grooves 2 (first section) and a section (second section), which continues from the section arranged inside the grooves 2, and is arranged outside the grooves 2.

Ag may be used, for example, as a metal constituting the metal paste. However, as the metal, which may be used for the metal paste, it is not limited to Ag. Through control of oxygen partial pressure in the baking step, metals such as Cu and Ni may be applicable to the metal paste. By the above-mentioned Step 1 to Step 3, the wiring substrate 100 may be formed.

(Step 4) The first joint member 4 made of a glass frit or indium is formed on the second region 11 into a closed circular shape (box shape or closed loop state) so as to surround the first region 10 (FIG. 2D).

In other words, on the second region 11, the joint member is formed so as to intersect with the wirings 3 on at least parts of the wirings 3 positioned at the second region 11. The joint member 4 is not limited to the glass frit, and various kinds of the joint member may be used. However, in a case of forming the airtight container, the joint member is required to have adhesion and sealing property (airtightness) together. Further, in the region 11, parts of the respective wirings 3 are preferably in a buried state by the joint member 4. Specifically, it is preferred to employ a structure in which an upper surface and side surfaces of the wiring are covered by the joint member 4.

In a case of using the glass frit as the joint member 4, the glass frit is printed into a predetermined pattern by a screen printing method, and after a solvent drying process at temperatures of 80 to 120° C., the glass frit is fixed onto the wirings 3 and the substrate 1 through semi-baking at about 300° C.

(Step 5) A frame 5 is arranged on the joint member 4 (FIG. 2E).

The material of the frame 5 is not particularly limited, but the material is preferably an insulating material (for example, glass) from the viewpoints of preventing short-circuits among the wirings 3 from occurring.

In a case where the joint member 4 is made of the glass frit, the frame 5 is arranged on the glass frit, and after that, heating is carried out at temperatures of 400 to 500° C. to fix the frame 5 and the substrate 1 through intermediation of the glass frit 4.

(Step 6) The second substrate 31 is provided, and on a surface of the second substrate 31, which is caused to face the first substrate 1, the second joint member 41 is provided by the same manner as in Step 4. Then, the second substrate 31 provided with the second joint member 41 is placed on the frame 5, and the frame 5 and the second substrate 31 are joined with the joint member 41 (FIG. 2F).

Through Step 1 to Step 6 described above, the airtight container 101 may be formed.

Through control of atmosphere in Step 6, the inside space 90 of the airtight container 101 may be made into a predetermined atmosphere. For example, if Step 6 is carried out under a nitrogen gas atmosphere, the inside space 90 may be made into a nitrogen atmosphere, thereby being applicable to an organic EL display. Further, if Step 6 is carried out under a discharge gas atmosphere, the airtight container is applicable to a plasma display. In addition, if Step 6 is carried out under a vacuum atmosphere, the airtight container is applicable to a field emission display.

Note that, in the examples described herein, Step 4 to Step 6 are carried out as separate steps, but may be carried out simultaneously. Further, the first substrate 1 and the second substrate 31 are spaced apart from each other, there are cases where the frame 5 may not be provided depending on a distance (gap) to be separated. For example, in the airtight container for PDP, and in the airtight container for LCD, a gap between the first substrate and the second substrate is so short that there are many cases where the frame 5 is not provided. In such a case, the first substrate 1 and the second substrate 31 are joined through intermediation of the joint member (without intermediation of frame 5). In addition, in this case, a separate member was used for the frame 5 from the first substrate and the second substrate. However, the frame 5 may be joined in advance to the first substrate 1 or the second substrate 31. Further, a section corresponding to the frame 5 may integrally be formed in advance onto the first substrate 1 and/or the second substrate 31.

Figure 4A:
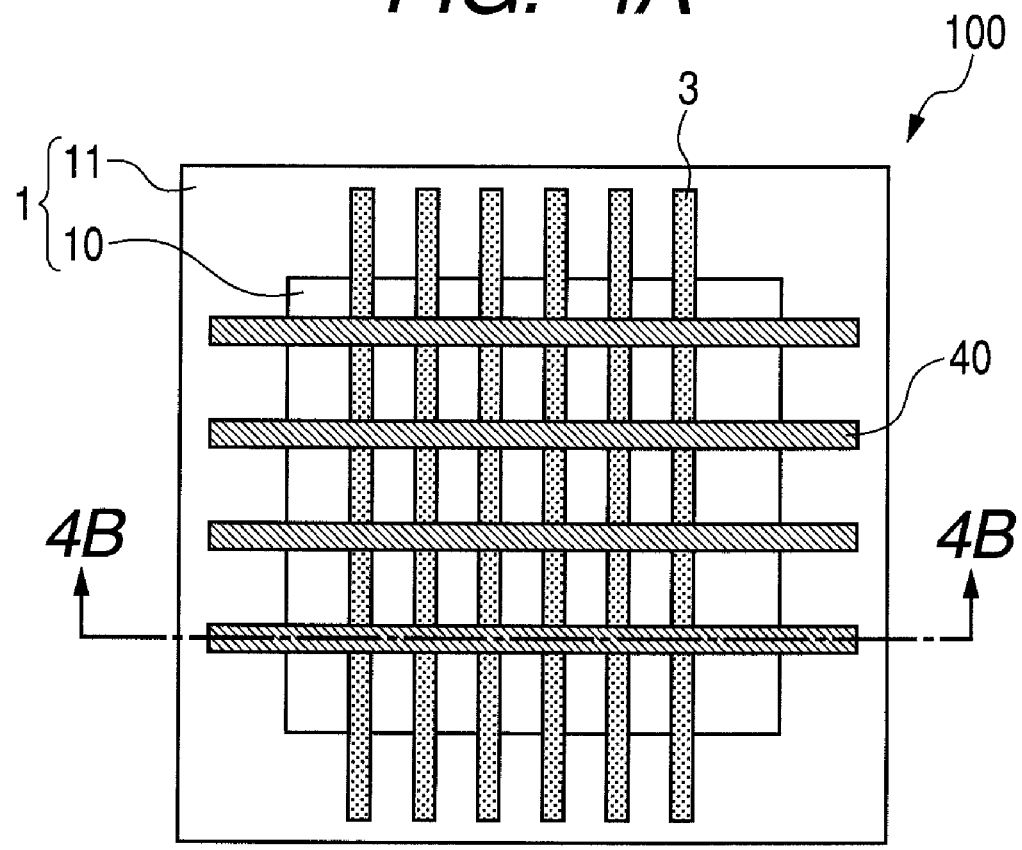
FIGS. 4A and 4B are a plan view and a sectional view of a modified example of the substrate constituting the airtight container of the present invention.
Figure 4B:
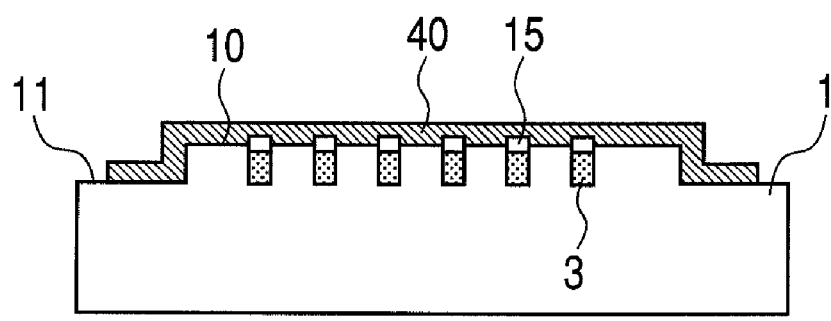

Further, in this case, description was made of an example in which a plurality of the wirings 3 extending in one direction are only formed on the substrate 1. However, depending on use of the wiring substrate 100, as illustrated in FIGS. 4A and 4B, a plurality of wirings 40 extending in a direction intersecting with the wirings 3 may be formed. Note that, FIG. 4B is a schematic sectional view taken along the line 4B-4B of FIG. 4A. The wirings (3 and 40) thus intersecting with each other are formed, and a variety of devices are provided to intersections, whereby the devices at the intersections may be driven individually and independently. For example, if the EL devices are provided to the intersections, it is possible to constitute an EL display. Further, if field emission devices, MIM type electron emission devices, or surface conduction electron emission devices are provided to the intersections, and phosphors and anodes are provided on the second substrate 31, it is possible to constitute a field emission display or a surface conduction electron emission display.

EXAMPLES

Hereinafter, the present invention is described with reference to more specific examples.

Figure 5A:
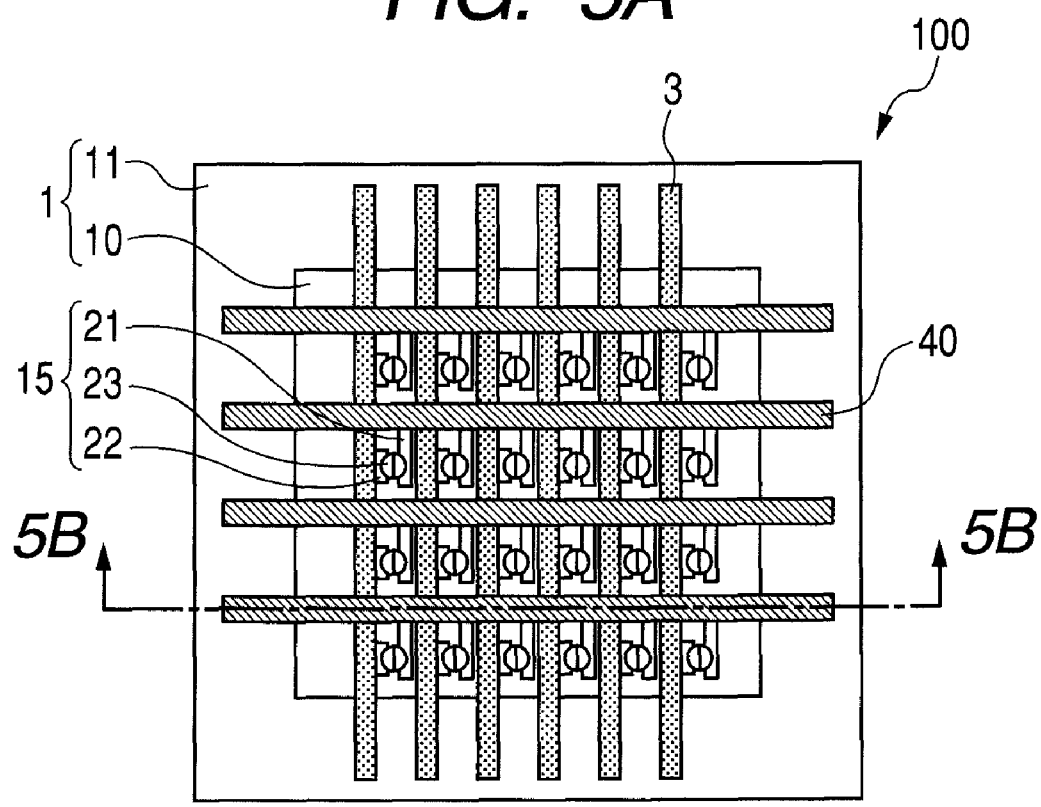
FIGS. 5A and 5B are a plan view and a sectional view of another modified example of the substrate constituting the airtight container of the present invention.
Figure 5B:
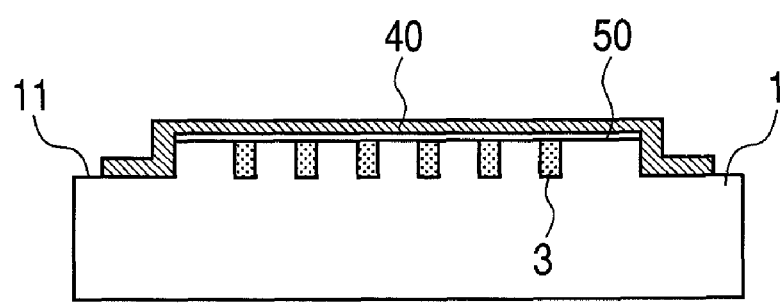

Examples in which the present invention is used are described with reference to FIGS. 2A to 2F, FIGS. 3A to 3C, and FIGS. 5A and 5B. In this example, a display panel is formed, which uses an airtight container including a wiring substrate 100 provided with surface conduction electron emission devices 15 as illustrated in FIGS. 5A and 5B. Note that, for simplification of description, FIGS. 2A to 2F and FIGS. 3A to 3C were used. However, in this example, to a structure illustrated in FIGS. 2A to 2F and FIGS. 3A to 3C, the electron emission devices 15 and wirings 40 are added as illustrated in FIGS. 5A and 5B.

(Step 1)

On a surface of a glass substrate 1 having a size of 300 mm×350 mm (vertical×lateral) and a thickness of 2.8 mm, Pt film is formed on an entire surface into a thickness of 40 nm by a sputtering method. Subsequently, patterning is carried out by a photolithography method to form multiple numbers of first electrodes 21 and second electrodes 22, which constitute the surface conduction electron emission devices 15. Like this, a substrate 1 is first provided (refer to FIG. 2A).

(Step 2)

Subsequently, a resist for sand blasting is formed by patterning by a photolithography method. Then, the surface of the substrate 1 of the section, which is not covered with resist, is cut away by a sand blasting method, thereby forming a plurality of grooves 2 and a second region 11 by digging down the outer periphery of a first region 10 (refer to FIG. 2B). In this example, a width of the grooves 2 is set to 280 μm, and a depth is set to 60 μm at a center portion thereof.

(Step 3)

A conductive paste (Ag paste) is printed by a screen printing method so that the conductive paste is thrown inside the respective grooves 2. After that, a solvent drying process is carried out at 90° C. for 10 minutes, and an atmospheric baking process is carried out at 480° C. for 20 minutes to form the first wirings 3 (refer to FIG. 2C). Ag charging amount is adjusted so that the thickness of the wirings 3 after the baking has the same degree of the depth of the grooves 2.

(Step 4)

An insulating paste containing as a main component bismuth oxide is formed by patterning by the screen printing method, and an insulating layer 50 having 30 μm in thickness for insulating the intersections between the wirings 3 and the second wirings 40, which are orthogonal to the wirings 3, is formed later (refer to FIG. 5B). The insulating layer 50 is subjected to, after printing the insulating paste, the solvent drying process at 90° C. for 10 minutes, and after that, the atmospheric baking process is carried out at a temperature of 500° C. for 20 minutes.

(Step 5)

A conductive paste (Ag paste) is printed by a screen printing method, and the second wirings 40 are formed in a direction orthogonal to the first wirings 3 (refer to FIG. 5B). At this time, the second wirings 40 are formed so as to intersect with the first wirings 3 under an insulated state by the insulating layer 50, and so as to be connected to one end of the first electrodes 21 that constitute the electron emission devices 15. The wirings 40 each are set to have a width of 40 μm and a thickness of 10 μm in this example.

(Step 6)

Subsequently, a conductive film 23, which constitutes the electron emission device 15, is formed. The conductive film 23 is formed by applying an organic palladium-containing solution by an ink-jet method so as to connect the first electrode 21 and the second electrode 22, and followed by baking. The formed conductive film 23 is a palladium oxide film.

(Step 7)

After that, the substrate 100 is moved into a vacuum chamber, and the conductive film 23 is subjected to current conduction treatment through the wiring 3 and the wiring 40, thereby forming a gap at a part of the conductive film 23. Through the above-mentioned steps, an electron source substrate in which the first wirings 3 and the second wirings 40 are connected is formed in the respective electron emission devices 15 (FIGS. 5A and 5B).

(Step 8)

The first joint member 4 made of the glass frit is formed on the second region 11 so as to surround the first region 10 (FIG. 2D). The glass frit is printed by the screen printing method so as to surround the first region 10, and after the solvent drying process at temperature of 80 to 120° C., the glass frit is fixed onto the wirings 3 and the wirings 40, and the substrate 1 through semi-baking at about 300° C.

(Step 9)

The glass frame 5 is arranged on the joint member 4 (FIG. 2E).

The frame 5 is arranged on the glass frit 4, and is heated thereafter at temperatures of 400 to 500° C., whereby the frame 5 and the substrate 1 are joined through the glass frit 4.

(Step 10)

The second substrate 31 is provided, and the second joint member 41 made of indium is formed on a surface of the second substrate 31, which is caused to face the first substrate 1. Then, the second substrate 31, on which the second joint member 41 is formed, is placed on the frame 5 and heated within a vacuum chamber to melt the indium, whereby the frame 5 and the second substrate 31 are joined (FIG. 2F). Note that, a phosphor film and a metal back is formed in advance on the second substrate 31. Through the above-mentioned steps, the airtight container (display panel) 101 in which the inside space 90 is kept in vacuum is formed. Then, a known driving circuit and a power source are connected to the wirings (3 and 40) and the metal back of the airtight container 101, whereby the display device (flat panel display) is formed.

The thus formed display device was driven to display an image, and heat cycle tests at temperatures from −20° C. to 80° C. were carried out. As a result, there occurred no vacuum leak, and an excellent image could be obtained for a long period of time.

On the other hand, in Step 2, in a case where the display panel was formed without digging the section of the glass substrate 1, which corresponds to the second region 11, there occurred degradation of the display image with significant speed compared to the display panel formed in this example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-148200, filed Jun.5, 2008, which is hereby incorporated by reference herein in its entirety.

What is claimed is:

1. An airtight container comprising:
a first substrate;
a second substrate facing the first substrate and joined thereto using joint members, with the first substrate having a groove extending on a surface of the first substrate and a wiring provided along a direction of the extended groove, wherein
the wiring comprises a section inside and along the groove, and a section outside the groove and extending from the section inside the groove, and
the first substrate includes first joint members provided on and across the section of the wiring outside the groove, and
a frame joined on the second substrate by second joint members is interposed between the first substrate and the second substrate, and the frame is joined to the first substrate by the first joint members.

2. An image display apparatus comprising an airtight container, wherein the airtight container is the airtight container according to claim 1.

3. An airtight container comprising:
a first substrate;
a second substrate facing the first substrate and joined thereto using joint members, with the first substrate having a groove extending on a surface of the first substrate and a wiring provided along a direction of the extended groove, wherein
the wiring comprises a section inside and along the groove and a section outside the groove extending from the section inside the groove, and
the first substrate and the second substrate are joined using interposing joint members provided on and across the section of the wiring outside the groove, and
the surface of the first substrate comprises a first region, and a second region surrounding the first region, the joint members are provided in the second region such that the joint members surround the first region, and the wiring extends over the first region to the second region.

4. An airtight container comprising:
a first substrate having a plurality of wirings;
a second substrate facing the first substrate and joined thereto using joint members, wherein
the first substrate has on a surface thereof a plurality of grooves extending in a same direction,
each of the plurality of wirings comprises (i) a section inside any one of the plurality of grooves and along a direction of the plurality of grooves and (ii) a section outside the groove extending from the section inside the groove; and
the first substrate and the second substrate are joined by interposing joint members, the joint members provided on and across the section of the wiring outside the groove, and
the surface of the first substrate comprises a first region, and a second region surrounding the first region, with the plurality of the grooves provided only in the first region, and the joint members are provided in the second region such that the joint members surround the first region, and each of the plurality of the wirings extends over the first region to the second region.

5. An image display apparatus comprising an airtight container, wherein the airtight container is the airtight container according to claim 4.

6. A manufacturing method of an airtight container comprising a first substrate and a second substrate facing the first substrate and joined thereto, the first substrate having a groove extending on a surface of the first substrate and a wiring provided along a direction of the groove, the manufacturing method comprising the steps of:
providing a first substrate having a groove extending on a surface thereof, and forming a wiring that extends from inside of the groove to outside of the groove,
providing joint members on a section of the wiring outside the groove such that the joint members are disposed across the wiring, and
joining the first substrate and the second substrate using interposing joint members, and further comprising the steps of:
joining a frame on the second substrate using joint members, and
joining the frame to the first substrate using joint members.

7. The manufacturing method of the airtight container according to claim 6, wherein the wiring is formed by disposing a conductive paste on the groove using printing.

8. A manufacturing method of an image display apparatus comprising an airtight container, wherein the airtight container is manufactured by the manufacturing method according to claim 6.

\* \* \* \* \*